US009191743B2

(12) United States Patent
Beer

(10) Patent No.: US 9,191,743 B2
(45) Date of Patent: Nov. 17, 2015

(54) APPARATUS USING MISSING FUNDAMENTAL FREQUENCIES TO IMPROVE LOUDSPEAKER SOUND FOCUSING

(75) Inventor: Daniel Beer, Martinroda (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 1159 days.

(21) Appl. No.: 12/936,463

(22) PCT Filed: Feb. 26, 2009

(86) PCT No.: PCT/EP2009/001380

§ 371 (c)(1), (2), (4) Date: Feb. 23, 2011

(87) PCT Pub. No.: WO2009/124618

PCT Pub. Date: Oct. 15, 2009

(65) Prior Publication Data

US 2011/0142258 A1 Jun. 16, 2011

Related U.S. Application Data

(60) Provisional application No. 61/106,863, filed on Oct. 20, 2008.

(30) Foreign Application Priority Data

Apr. 9, 2008 (DE) ......................... 10 2008 018 030
Dec. 16, 2008 (EP) ..................................... 08021850

(51) Int. Cl.
*H03G 3/00* (2006.01)
*H04R 3/12* (2006.01)
*H04R 3/04* (2006.01)

(52) U.S. Cl.
CPC .. *H04R 3/12* (2013.01); *H04R 3/04* (2013.01); *H04R 2201/403* (2013.01); *H04R 2430/03* (2013.01); *H04R 2430/20* (2013.01)

(58) Field of Classification Search
USPC ........................................ 381/61, 77, 80, 98
See application file for complete search history.

(56) References Cited

U.S. PATENT DOCUMENTS 6,134,330 A 10/2000 De Poortere et al.
6,775,388 B1 8/2004 Pompei (Continued)

FOREIGN PATENT DOCUMENTS

DE 69921558 T2 3/2006
EP 1484944 A2 12/2004

(Continued)

OTHER PUBLICATIONS

Bowler, Ned W. A fundamental frequency analysis of harsh vocal quality. 1957. 4. Web. Feb. 6, 2013. <http://books.google.com/books?id=iJgUAAAAIAAJ&q=lowest>.*

(Continued)

*Primary Examiner* — Joseph Saunders, Jr.
*Assistant Examiner* — James Mooney
(74) *Attorney, Agent, or Firm* — Michael A. Glenn; Perkins Coie LLP

(57) ABSTRACT

An apparatus for processing an audio signal to focus an acoustic signal by an arrangement of a plurality of loudspeakers comprises a frequency analyzer, a signal processor and a signal output interface. The acoustic signal is based on the audio signal. The frequency analyzer is configured to determine a fundamental frequency in a frequency spectrum of the audio signal depending on a geometry parameter of the arrangement of the plurality of loudspeakers. The signal processor is configured to adapt an overtone of the fundamental frequency to obtain the processed audio signal and the signal output interface is configured to output the processed audio signal to the plurality of loudspeakers.

14 Claims, 5 Drawing Sheets

(56) References Cited

U.S. PATENT DOCUMENTS

| | | | | |
|---|---|---|---|---|
| 7,391,872 | B2 | 6/2008 | Pompei | |
| 2001/0007591 | A1 | 7/2001 | Pompei | |
| 2005/0207590 | A1 | 9/2005 | Niehoff et al. | |
| 2005/0248233 | A1 | 11/2005 | Pompei | |
| 2008/0118084 | A1 * | 5/2008 | Moon et al. | 381/98 |
| 2008/0285777 | A1 | 11/2008 | Pompei | |
| 2009/0016543 | A1 * | 1/2009 | Maruko et al. | 381/61 |
| 2009/0141915 | A1 * | 6/2009 | Ko et al. | 381/182 |

FOREIGN PATENT DOCUMENTS

| | | |
|---|---|---|
| JP | 2005-12765 | 1/2005 |
| JP | 2006-222670 | 8/2006 |
| JP | 2008-67041 | 3/2008 |

OTHER PUBLICATIONS

Machine Translation of JP 2006-222670 A. Web. Feb. 2013. <http://dossier1.ipdl.inpit.go.jp/AIPN/odse_call_transl.ipdl?N0000=7413&N0005=Ei7BzenZVnBvfz7D1ZIK&N0120=01&N2001=2&N3001=2006-222670&Ntt3=electronicsV14&Ntt4=gakujutsuV14&Ntt5=computerV14&Ntt6=&Ntt7=&Ntt8=&Ntt9=&Ntt10=&Ntt11=&Ntt12=>.*

Ben-Tzur, D. et al.: The Effect of MaxxBass Pyschoacoustic Bass Enhancement on Loudspeaker Design, 106$^{th}$ AES Convention, 10 pages, Munich, Germany, May 1999, in Woon S. Gan, et al.; "Virtual bass for home entertainment, multimedia pc, game station and portable audio systems", IEEE Transactions on Consumer Electronics, vol. 47, No. 4, Nov. 2001, p. 787-794, at "http://www.srslabs.com/partners/aetech/trubass_theory.asp", at "http://vst-plugins.homemusician.net/instruments/virtual_bass_vb1.html", at "http://mp3.deepsound.net/plugins_dynamique.php", and at "http://www.srs-store.com/store-plugins/mall/pdf/WOW%20XT%Plug-inmanual.pdf".

"DEGA-Empfehlungen 101, Deutsche Gesellschaft für Akustik e.V., März 2006", in Yoomi Hur, et al.; "Highly focused sound beamforming algorithm using loudspeaker array system", presented at the 125$^{th}$ AES-Convention, Oct. 2-5, 2008, 6 pages, San Francisco; and in Jung-Woo Choi, et al., "Super-directive loudspeaker array for the generation of personal sound zone", presented at the 125$^{th}$ AES-Convention, Oct. 2-5, 2008, 10 pages, San Francisco.

Fastl, H. et al.; "Psycho-acoustics, 3$^{rd}$ edition" 2007, Springer, Berlin, Heidelberg, New York, XP002531153, p. 121; figure 5.10.

Karnapi, et al.; "Method to Enhance Low Frequency Perception from a Parametric Array Loudspeaker" AES Convention Paper, May 10, 2002-May 13, 2002, XP002531151, 5 pages.

Larsen, E.; Aarts, R.M.: Audio Bandwidth Extension, John Wiley & Sons, Ltd., West Sussex, England, 2004, pp. 55-61.

Olson, Harry F.: "Acoustical Engineering" Dec. 1991, Professional Audio Journals, Inc., Philadelphia, Pennsilvania, XP002531152; p. 36.

Urban, M., et al.; "Wavefront Sculpture Technology", presented at the 11th AES-Convention, Sep. 21-24, 2001, New York, 14 pages.

* cited by examiner

APPARATUS USING MISSING FUNDAMENTAL FREQUENCIES TO IMPROVE LOUDSPEAKER SOUND FOCUSING

CROSS-REFERENCE TO RELATED APPLICATION

This application is a U.S. National Phase entry of PCT/EP2009/001380 filed Feb. 26, 2009, and claims priority to U.S. Patent Application No. 61/106,863 filed Oct. 20, 2008, German Patent Application No. 102008018030.0 filed Oct. 20, 2008, and European Patent Application No. 08021850.6 filed Dec. 16, 2008, each of which is incorporated herein by references hereto.

BACKGROUND OF THE INVENTION

Embodiments according to the invention relate to an apparatus and a method for processing an audio signal to focus an acoustic signal by an arrangement of a plurality of loudspeakers, wherein the acoustic signal is based on the audio signal.

Some embodiments according to the invention relate to an improvement of sound focusing by using psychoacoustic effects.

In some applications, a directed emission of sound is desired. In this connection, the sound energy emitted by the sound source is to propagate in a preferred direction only. One possible application may be a sound system, that intends to provide a sound from the stage only to a certain audience area in the auditorium. The remaining auditorium should not be affected and/or unnecessary sound reflections on room walls are to be avoided this way. In terms of energy, the directed emission of sound may provide the possibility to emit the sound energy only in the direction in which it is needed.

The way in which sound is emitted from a sound source depends on the ratio of sizes between the sound-emitting surface and the considered wavelengths. In the case of wavelength (λ) being considerably larger than the membrane diameter, for example a canonical membrane, a non-directed sound emission takes place (see "Zollner, M.; Zwicker, E.: Elektroakustik, Springer-Verlag Berlin Heidelberg New York, 3. Auflage, 1. korrigierter Nachdruck 1998"). If the ratio is inverted, an increasing directed sound emission takes place with rising frequency and decreasing wavelength.

For loudspeaker arrays, the size of the array may, at least, correspond to half the wavelength of the lowest frequency in order to be able to emit sound in a directed way by the loudspeaker array, for example. Therefore, very large arrays are necessitated in particular for focusing down to low frequencies.

For example, there are two approaches for realization. The basis of the first approach is that the emitting area is made as large as possible with respect to the longest wavelength to be emitted. This approach is used, for example, in the Line-Array-Technology (see "Urban, M.; Heil, C.; Baumann, P.: Wavefront Sculpture Technology, presented at the 11$^{th}$ AES-Convention, 2001 Sep. 21-24, New York") used for large scale acoustic irradiation. By lining up acoustically-coupled single emitters, a large emitting membrane area is formed. In this approach, it is problematic that the dimensions of the sound source necessarily becomes unmanageably large.

If such large dimensions are not desired, a directed sound emission may be successful by decreasing the wavelength, instead of the size of the sound-emitting area, so that the ratio between the wavelength and the emitter size is met.

This approach is realized, for example, in ultrasonic loudspeakers (see EP 1 484 944 A2 or DE 699 21 558 T2). The problems of this approach consist in the non-proven harmlessness of the high ultrasonic doses for humans and in little low-frequency reproduction. Therefore, this approach is hardly used despite having been known for a longer period of time.

A possibility for extending the perceived low-frequency reproduction of sound sources is a use of a pyschoacoustic effect. It is known that the low frequency region perceived by humans may be enlarged by using pyschoacoustic effects. The reproduction bandwidth perceived by humans is not necessarily equal with the physically reproduced bandwidth of a sound source. By using pyschoacoustic effects, the reproduced signal may be changed such that a listener gets the impression that, for example, the perceived low-end cut off frequency is lower than the physically existing one.

This is done by processing the useful signal in such a way that the harmonic overtones of the fundamental waves are formed such that an enhanced low frequency impression develops. In this connection, the actual fundamental frequency only needs to be reproduced very weak or even not at all. An often-used pyschoacoustic effect is, for example, the missing fundamental effect. Here, the harmonic overtone structure of the signal is influenced such that despite of non-reproduced fundamental frequencies, the human believes to perceive these (see U.S. Pat. No. 6,134,330 or "Larsen, E.; Aarts, R. M.: Audio Bandwidth Extension, John Wiley & Sons, Ltd., West Sussex, England, 2004").

Some further examples for the psychoacoustic effect are shown in "Be-Tzur, D. et al.: The Effect of MaxxBass Pyschoacoustic Bass Enhancement on Loudspeaker Design, 106$^{th}$ AES Convention, Munich, Germany, 1999", in "Woon S. Gan, Sen. M. Kuo, Chee W. Toh: Virtual bass for home entertainment, multimedia pc, game station and portable audio systems, IEEE Transactions on Consumer Electronics, Vol. 47, No. 4, November 2001, page 787-794", at "http://www.srslabs.com/partners/aetech/trubass_theory.asp", at "http://vst-plugins.homemusician.net/instruments/virtual_bass_vb1.html", at "http://mp3.deepsound.net/plugins_dynamique.php", and at "http://www.srs-store.com/store-plugins/mall/pdf/WOW%20XT%Plug-inmanual.pdf".

Further examples for sound focusing are shown in "DEGA-Empfehlungen 101, Deutsche Gesellschaft für Akustik e.V., März 2006", in "Yoomi Hur, Seong-woo Kim, Young-cheol Park, Dae Hee Youn: Highly focused sound beamforming algorithm using loudspeaker array system, presented at the 125$^{th}$ AES-Convention, 2008 Oct. 2-5, San Francisco", and in "Jung-Woo Choi, Youngtae Kim, Sangchul Ko, Jungho Kim: Super-directly loudspeaker array for the generation of personal sound zone, presented at the 125$^{th}$ AES-Convention, 2008 Oct. 2-5, San Francisco".

SUMMARY

According to an embodiment, an apparatus for processing an audio signal to focus an acoustic signal by an arrangement of a plurality of loudspeakers, wherein the acoustic signal is based on the audio signal, may have: a frequency analyzer configured to determine a fundamental frequency in a frequency spectrum of the audio signal depending on a geometry parameter of the arrangement of the plurality of loudspeakers; a signal processor configured to adapt an overtone of the fundamental frequency to obtain the processed audio signal; and a signal output interface configured to output the processed audio signal to the plurality of loudspeakers.

According to another embodiment, a method for processing an audio signal to focus an acoustic signal by an arrangement of a plurality of loudspeakers, wherein the acoustic signal is based on the audio signal, may have the steps of: determining a fundamental frequency in a frequency spectrum of the audio signal depending on a geometry parameter of the arrangement of the plurality of loudspeakers; adapting an overtone of the fundamental frequency to obtain the processed audio signal; and outputting the processed audio signal to the plurality of loudspeakers.

Another embodiment may have a computer program with a program code for performing the inventive method, when the computer program runs on a computer or a microcontroller.

Embodiments according to the present invention are based on the central idea that a pyschoacoustic effect is used to improve the sound focusing, while the low-frequency impression for a listener stays nearly the same. The other way round, the low-frequency impression for a listener may be improved by using a psychoacoustic effect, while the sound focusing may stay constant.

For example, by using the missing fundamental effect, the lowest frequency to be focused is an overtone of a fundamental frequency. Since the wavelength of the harmonic overtone is less than half the wavelength of the fundamental frequency, the sound focusing is improved if the same arrangement of the plurality of loudspeakers is used, because higher frequencies can be better focused. The other way round, the same quality of the sound focusing may be reached with an arrangement of loudspeakers with half the size.

Therefore, the frequency analyzer determines a fundamental frequency based on the geometry parameter and the signal processor adapts the overtone of the fundamental frequency. In this way, a perceived low-end frequency may be achieved, which is far below the physical-existing low-end frequency. Also the sound focusing may be improved and/or the size of the arrangement of loudspeakers may be reduced.

Some embodiments according to the invention comprise a high-pass filter configured to attenuate the fundamental frequency determined by the frequency analyzer.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
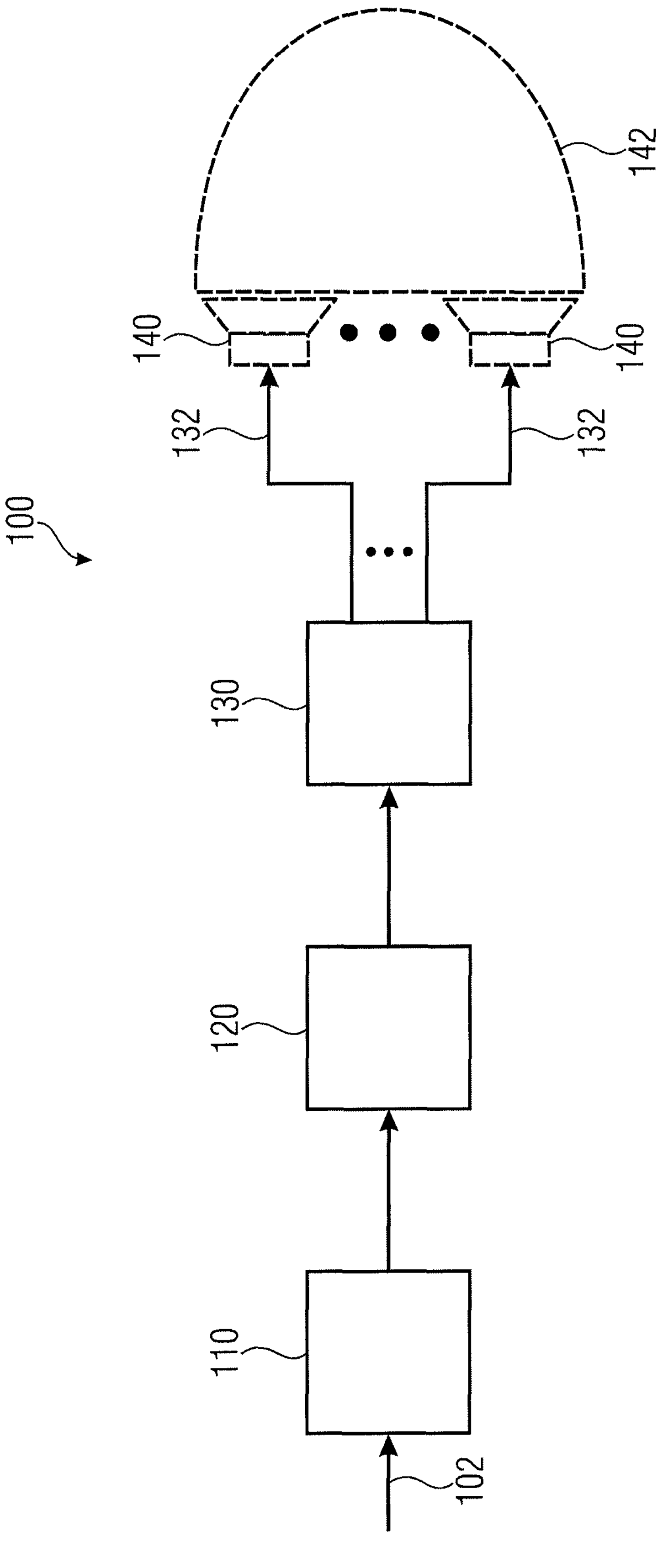
FIG. 1 is a block diagram of an apparatus for processing an audio signal.

FIG. 1 shows a block diagram of an apparatus 100 for processing an audio signal 102 to focus an acoustic signal 142 by an arrangement of a plurality of loudspeakers 140 according to an embodiment of the invention. The acoustic signal 142 is based on the audio signal 102. The apparatus 100 comprises a frequency analyzer 110, a signal processor 120 and a signal output interface 130.

The frequency analyzer 110 is connected to the signal processor 120 and configured to determine a fundamental frequency in a frequency spectrum of the audio signal 102 depending on a geometry parameter of the arrangement of the plurality of loudspeakers 140.

The signal processor 120 is connected to the signal output interface 130 and is configured to adapt an overtone of the fundamental frequency to obtain the processed audio signal.

The signal output interface 130 is configured to output the processed audio signal 132 to the plurality of loudspeakers 140.

By using the pyschoacoustic effect of the missing fundamentals, the sound focusing for the same arrangement for loudspeakers is improved, since it may be sufficient to adapt one or more overtones of fundamental frequencies and reproduced overtones to reach the same sound impression for a listener. The other way around, the arrangement of loudspeakers can be built considerably smaller, while the same quality of sound focusing and sound impression for the listener may be achieved.

For example, this may be of significant interest for loudspeakers of laptops and cell phones. There, it may be desired that the reproduced sound should only be heard by the user and not by other people next to them. This may also be called personal sound zone. A headset may not be needed anymore. Therefore, the sound system should be small in order to be implemented into the laptop or cell phone, while reaching a strong-directed emission of sound and a high sound quality for the listener.

The frequency analyzer 110 may analyze the frequency spectrum of the audio signal 102 to determine a fundamental frequency depending on the geometry parameter. For example, the geometry parameter may define a cut off frequency and the analysis of the frequency spectrum of the audio signal 102 may determine a fundamental frequency below the cut off frequency. This cut off frequency may be related to a physical bandwidth of the arrangement of loudspeakers 140 for focusing an acoustic signal.

The geometry parameter may be based on a largest dimension of the arrangement of the plurality of loudspeakers 140. For example, the plurality of loudspeakers 140 may be arranged in a line and the geometry parameter may be equal to the distance of the both outermost loudspeakers. The distance may be measured between the centers of the loudspeaker or between the outermost points of the loudspeakers.

An alternative may be a circular arrangement of the plurality of loudspeakers 140, wherein the geometry parameter may be equal to the diameter of the circular area array.

Line arrays are, for example, used as horizontal lines at TV sets or as vertical lines in churches.

Line arrays may mainly focus sound in one direction and circular arrays may focus sound in two directions.

The arrangement of loudspeakers 140 may not be able to focus signals with frequencies below the cut off frequency linked to the geometry parameter. For example, if the geometry parameter is equal to the length (the distance of both outermost loudspeakers) of a line array (a plurality of loudspeakers arranged in a line), the cut off frequency may correspond to a cut off wavelength of twice the geometry parameter.

The frequency analyzer 110 may be configured to determine a plurality of fundamental frequencies below a cut off frequency. Corresponding to this, the signal processor 120 may be configured to adapt one or more overtones of each determined fundamental frequency.

For example, the signal processor 120 may adapt the overtone by amplifying it. The signal processor 120 may be configured to adapt the plurality of overtones of the same fundamental frequency to improve the quality of the pyschoacoustic acoustic effect. The impression of the physically weak or non-existing fundamental frequency for a listener may be improved by adapting more overtones for the fundamental frequency. The signal processor 120 may be configured to amplify a plurality of overtones of the same fundamental frequency with a specific amplitude ratio. For example, the overtones three octaves above the fundamental frequency may be adapted. However, the effect may be already perceptible by adapting one overtone.

The signal output interface 130 may be configured to provide the processed audio signal to each loudspeaker of the plurality of loudspeakers. Alternatively, the signal output interface 130 may be configured to adjust, for example, the amplitude and/or the phase of the processed audio signal for each loudspeaker.

The dashed lines in FIG. 1 indicate the arrangement of the plurality of loudspeakers 140 and the focused acoustic signal 142. In this Fig., two loudspeakers 140 are shown, but the number of loudspeakers may be arbitrary. In this example, the two loudspeakers may be the outermost loudspeakers of a plurality of loudspeakers arranged in a line.

Some embodiments according to the invention comprise a high-pass filter configured to attenuate the fundamental frequency determined by the frequency analyzer. If the frequency analyzer determines a plurality of fundamental frequencies below a cut off frequency, which depends on the geometric parameter, the high-pass filter may be configured to attenuate the plurality of fundamental frequencies below the cut off frequency. In this way, frequencies, which cannot be focused by the arrangement of loudspeakers, because the wavelength is too large, may be attenuated and, therefore, the high-quality focusing of higher frequencies is not widened by the low frequency content of the audio signal. For example, this is of interest for a personal sound zone of a laptop or a cell phone.

For example, a line array with a length of one meter may be able to perform a directed emission for frequencies down to 600 Hz. The other way round, for a directed emission of frequencies down to 100 Hz, an array with a length of 1.7 m ($\lambda/2$) would be necessitated.

The distance of the outermost loudspeakers of a line array is important, because the first extinction of the acoustic signal may be determined by this distance. In other words, the low-end cut off frequency for focusing the acoustic signal may be determined by the distance between the outermost loudspeakers. An upper-end cut off frequency may be determined by the distance between two neighboring loudspeakers.

The fundamental frequencies may not be attenuated if a larger array than necessitated is used.

Some further embodiments according to the invention comprise an overtone generator configured to generate the overtone of the fundamental frequency. If the frequency spectrum of the audio signal does not or only weakly comprise a portion with the frequency of the overtone of the fundamental frequency, the overtone may be generated by the overtone generator. In some cases, the overtone generator may generate a plurality of overtones for the same fundamental frequency.

A generated overtone may be adapted by the signal processor 120.

Figure 2:
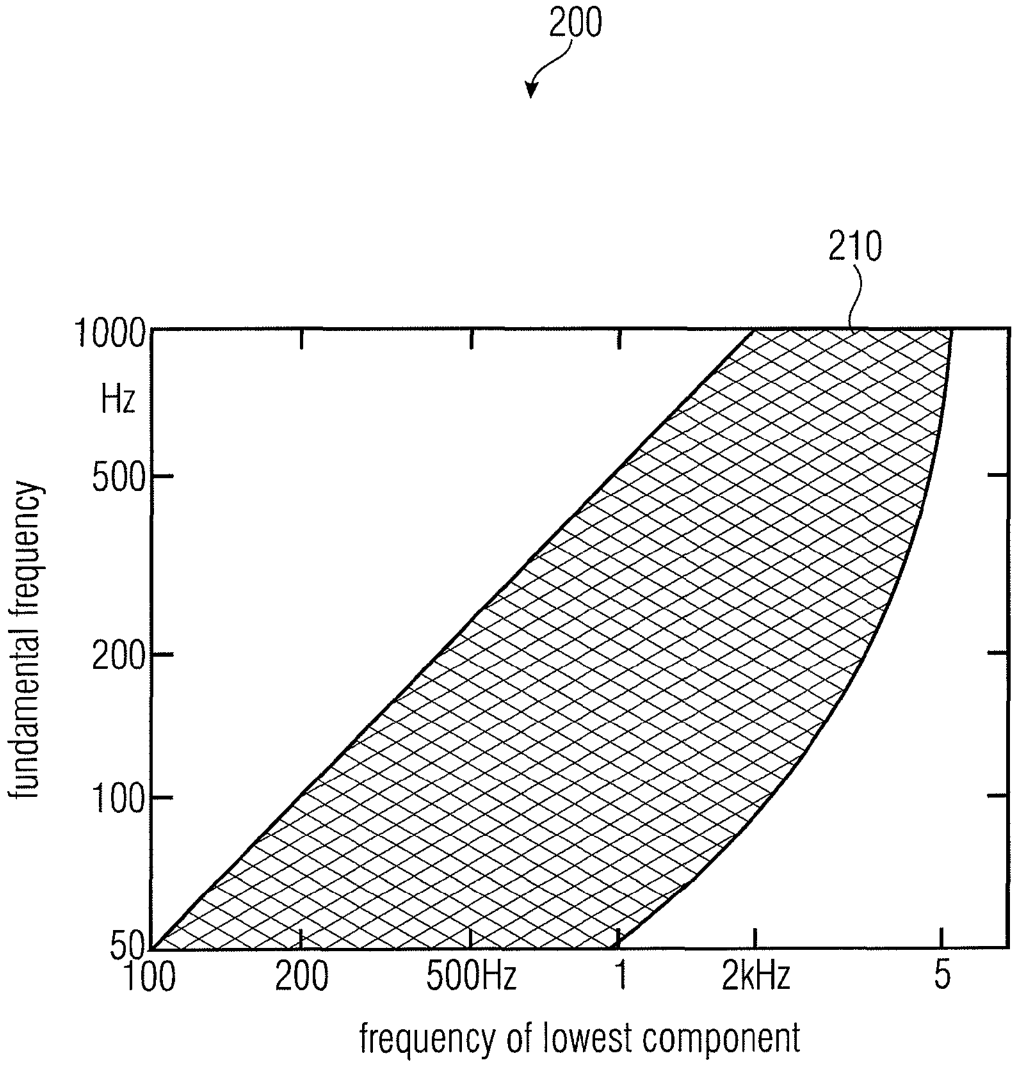
FIG. 2 is a fundamental frequency vs. the frequency of the lowest component diagram.

FIG. 2 shows a fundamental frequency vs. a frequency of the lowest component diagram 200. The diagram 200 shows the region of existence 210 (dark area) of the virtual pitch of the tone, wherein the ordinate shows the fundamental frequency and the abscissa shows the harmonic (part of the tone). The dark area is the region where a harmonic (the overtone) should exist to generate the virtual pitch of a tone. In other words, to generate the missing fundamental effect, at least one overtone of the fundamental frequency, which may be the lowest overtone (lowest component), should have a frequency within the dark area 210.

For example, a complex sound with a fundamental frequency of 50 Hz still produces a virtual pitch of a tone (the missing fundamental effect) if its lowest spectral line (the overtone with the lowest frequency to be adapted) comprises a frequency lower than 1 kHz. That means, for the example with a fundamental frequency of 50 Hz, only up to the $20^{th}$ harmonic, a virtual picture of a tone may be generated.

The developing sound is called residual sound and the corresponding listening perception is called virtual pitch of a tone.

Therefore, the frequency of the overtone to be adapted should be lower than thirty times the fundamental frequency.

Figure 3:
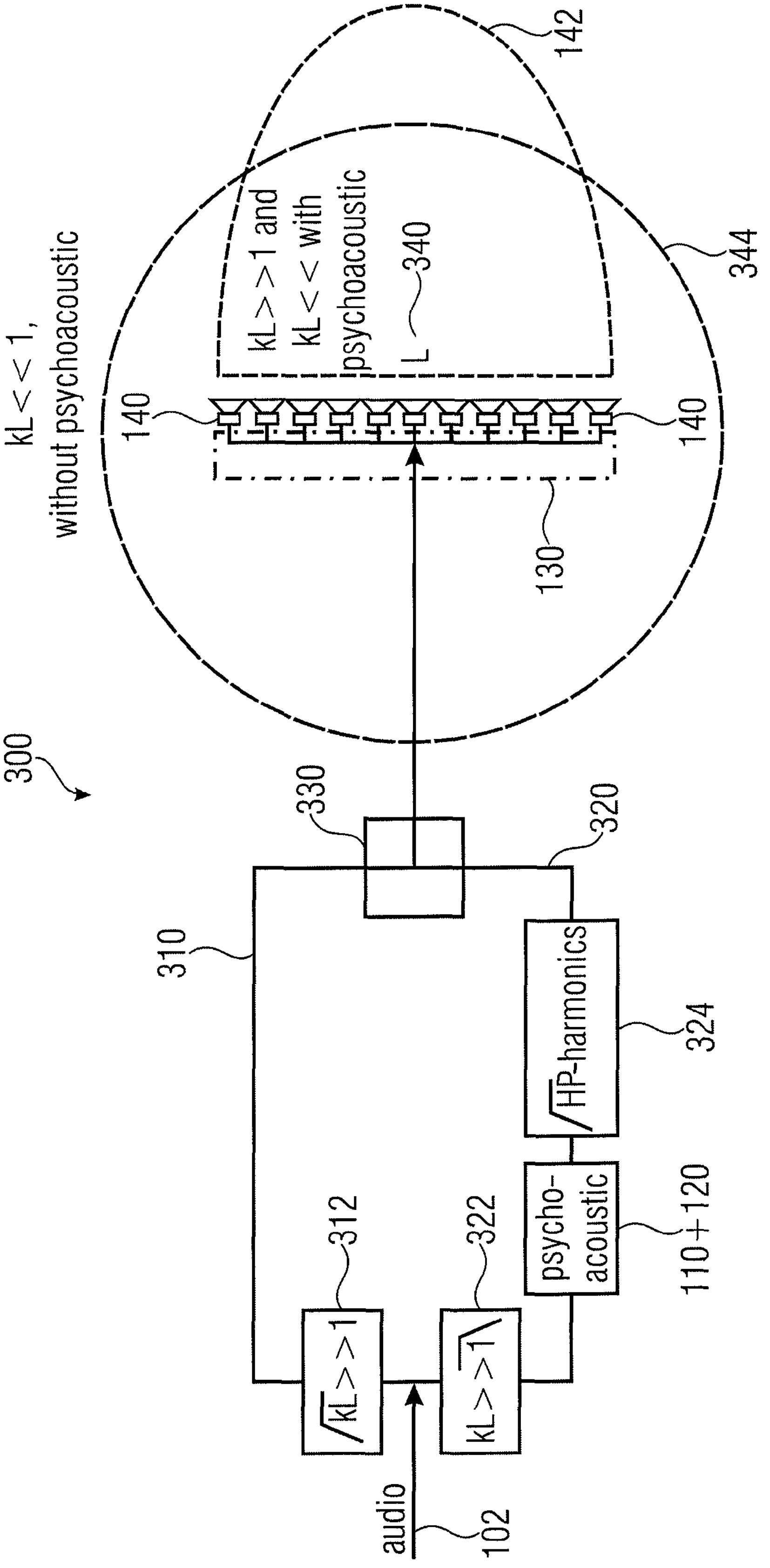
FIG. 3 is a block diagram of an apparatus for processing an audio signal.

FIG. 3 shows a block diagram of an apparatus 300 for processing an audio signal 102 to focus an acoustic signal 142 by an arrangement of a plurality of loudspeakers 140 according to an embodiment of the invention. The apparatus 300 comprises a first signal path 310 and a signal path 310 and the second signal path 320.

The first path 310 comprises a high-pass filter 312 with a cut off frequency equal to a characteristic frequency. The first signal path 310 is therefore configured to process frequencies of the audio signal 102 higher than the characteristic frequency.

The second signal path 320 comprises a low-pass filter 322 with a cut off frequency equal to the characteristic frequency. Therefore, the second signal path 320 is configured to process frequencies of the audio signal 102 lower than the characteristic frequency. The characteristic frequency is based on the geometry parameter L 340 and may be, for example, larger than $\lambda/2$ ($L \geq \lambda/2$). Frequencies processed in the first signal path 310 may fulfill the requirement that $kL>>1$, wherein k is the wave number of a frequency. Correspondingly, frequencies processed in the second signal path 320 may fulfill the requirement that $kL<<1$.

Further, the second signal path 320 comprises a pyschoacoustic block, which comprises the frequency analyzer 110 and the signal processor 120 and a high-pass filter 324 for the overtones (HP-harmonics). The high-pass filter 324 for the overtones may attenuate the fundamental frequencies.

Furthermore, the apparatus 300 comprises a combiner 330 configured to overlay the signal processed in the first signal path 310 and the signal processed in the second signal path 320. The combiner 330 is connected to the signal output interface 130 (shown by the rectangle with the chain dotted lines) and the signal output interface 130 is connected to the arrangement of the plurality of loudspeakers 140.

The area in front of the loudspeakers marked with a dashed line indicates the focused acoustic signal 142. The dashed circle 344 indicates how the emission of the acoustic signal may look like for low frequencies without taking advantage of the psychoacoustic effect.

The combiner 330 may be configured to adjust the amplitude and/or the phase of signals processed in the first signal path 310 and/or signals processed in the second signal path 320.

Figure 4:
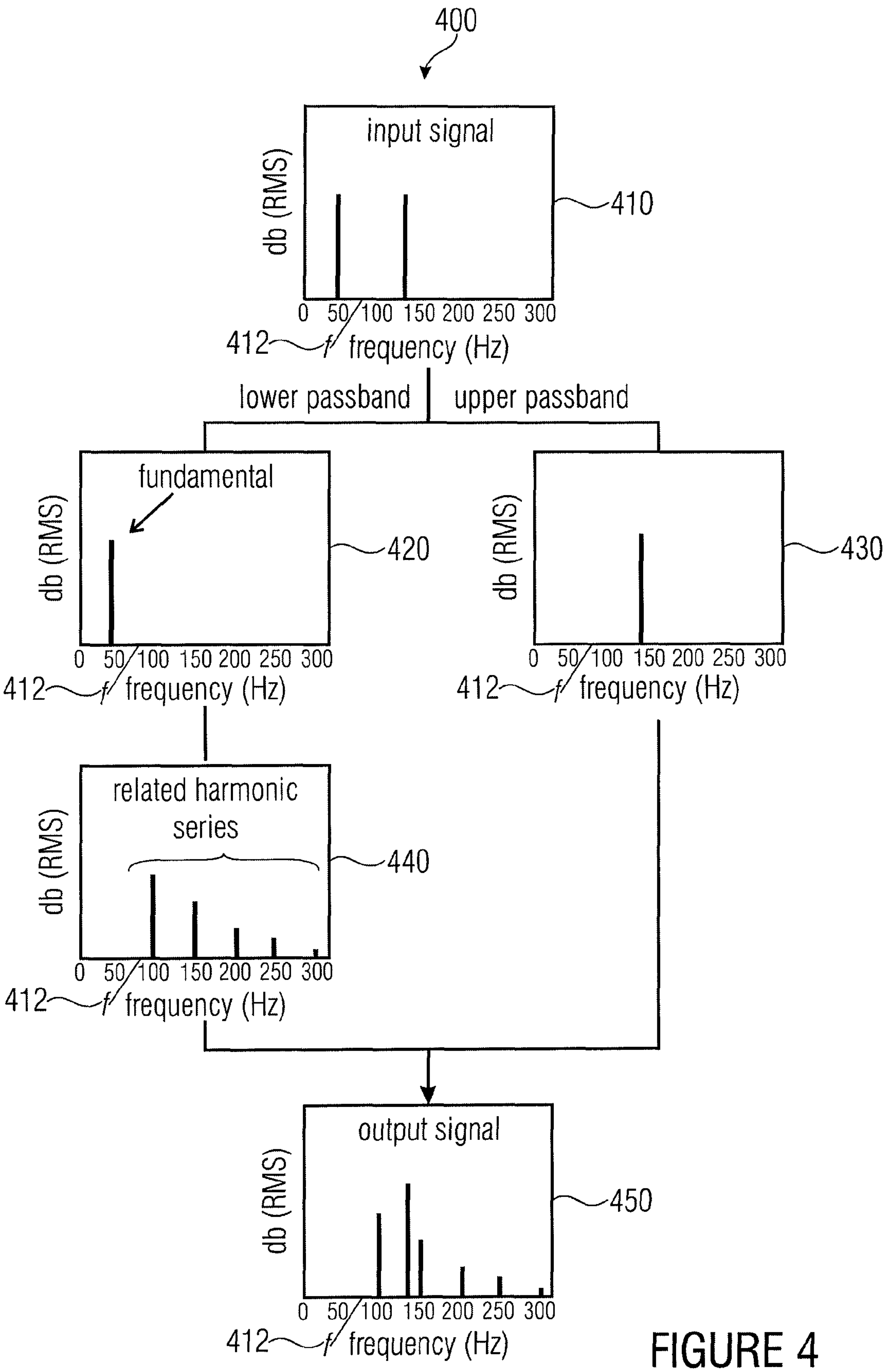
FIG. 4 is a schematic illustration of the processing of the audio signal.

Fittingly, FIG. 4 shows a schematic illustration 400 of the processing of the audio signal. In this example, the frequency spectrum 410 of the audio signal is composed of two frequencies (50 Hz, 140 Hz). Based on the geometry parameter, the cut off frequency f 412 of the high-pass filter 312 in the first signal path 310 and the low-pass filter 322 in the second signal path 320 may be, for example, 90 Hz. Then, a frequency spectrum 430 of the signal processed in the first signal path 310 comprises a frequency portion at 140 Hz and a frequency spectrum 420 of the signal processed in the second signal path 320 comprises a frequency portion at 50 Hz. Then, a harmonic image for each fundamental frequency below the cut off frequency may be created and matched for pitch and loudness. In other words, the adapted overtones of the fundamental frequencies may be matched for pitch and loudness of the original fundamental frequency.

For fundamentals down to the half of the cut off frequency (for example, one octave below the cut-off), the harmonic image may consist primarily of the second and third harmonic (the first and second overtones). For fundamentals down to a third of the cut off (approximately 1.5 octaves), the harmonic image may consist primarily of the third and fourth harmonics. The harmonics dynamic range may be controlled such that their perceived loudness will match that of the (intended) original fundamental.

In this way, a perceived lower frequency may be reached that lies 1.5 octaves below the physical existing low-end frequency.

The frequency spectrum 440 shows one example for a related harmonic series (harmonic image) with an attenuated or a suppressed fundamental frequency. The frequency spectrum 450 of the processed audio signal or output signal comprises the frequencies of the combined signals of the first signal path 310 and the second signal path 320.

Figure 5:
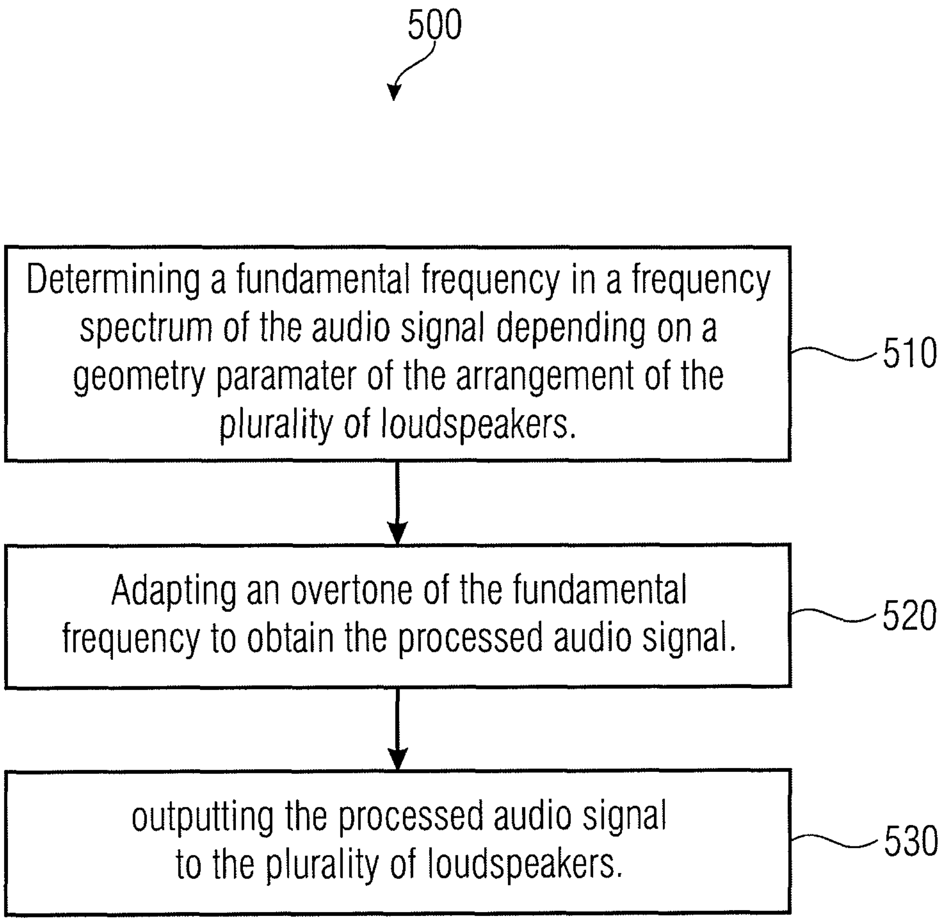
FIG. 5 is a flow chart of a method for processing an audio signal.

FIG. 5 shows a flow chart of a method 500 for processing an audio signal to focus an acoustic signal by an arrangement of a plurality of loudspeakers according to an embodiment of the invention. The acoustic signal is based on the audio signal. The method 500 comprises determining 510 a fundamental frequency, adapting 520 an overtone of the fundamental frequency and outputting 530 the processed audio signal.

The fundamental frequency in a frequency spectrum of the audio signal is determined depending on a geometry parameter of the arrangement of the plurality of loudspeakers.

Further, the overtone of the fundamental frequency is adapted to obtain the processed audio signal.

The processed audio signal is outputted to the plurality of loudspeakers.

Some embodiments according to the invention relate to the combination of the use of pyschoacoustic approaches for a low-frequency extension and an approach of a directed sound emission by a sound-emitting area sufficiently large with respect to the wavelength considered. For example, if the size of the emitting area is too small for emitting even lower frequencies in directed manner, the perceived low frequency region may be extended by e.g. 1.5 octaves and at the same time be perceived as directed by the directed emission of the harmonic overtones.

In the present application, the same reference numerals are partly used for objects and functional units having the same or similar functional properties.

In particular, it is pointed out that, depending on the conditions, the inventive scheme may also be implemented in software. The implementation may be on a digital storage medium, particularly a floppy disk or a CD with electronically readable control signals capable of cooperating with a programmable computer system so that the corresponding method is executed. In general, the invention thus also consists in a computer program product with a program code stored on a machine-readable carrier for performing the inventive method, when the computer program product is executed on a computer. Stated in other words, the invention may thus also be realized as a computer program with a program code for performing the method, when the computer program product is executed on a computer.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An apparatus for processing an audio signal to focus an acoustic signal by an arrangement of a plurality of loudspeakers, wherein the acoustic signal is based on the audio signal, comprising:

a low-pass filter configured to attenuate frequencies higher than a low-pass cut off frequency, wherein the low-pass cut off frequency is based on a geometry parameter of the arrangement of the plurality of loudspeakers;

wherein the plurality of loudspeakers is arranged in a line and the geometry parameter is equal to the distance of both outermost loudspeakers, or wherein the plurality of loudspeakers is arranged circular and the geometry parameter is equal to the diameter of the circular arrangement, a frequency analyzer configured to determine a fundamental frequency in a frequency spectrum of the audio signal depending on the geometry parameter of the arrangement of the plurality of loudspeakers;

an overtone generator configured to generate an overtone of the fundamental frequency;

a signal processor configured to adapt the overtone of the fundamental frequency to obtain the processed audio signal; and a signal output interface configured to output the processed audio signal to the plurality of loudspeakers.

2. The apparatus for processing an audio signal according to claim 1, wherein a frequency of the overtone is lower than 30 times the fundamental frequency.

3. The apparatus for processing an audio signal according to claim 1, wherein the signal processor is configured to adapt a plurality of overtones of the fundamental frequency.

4. The apparatus for processing an audio signal according to claim 1, wherein the frequency analyzer is configured to determine a plurality of fundamental frequencies and wherein the signal processor is configured to adapt an overtone for each determined fundamental frequency.

5. The apparatus for processing an audio signal according to claim 1, wherein a wavelength of the fundamental frequency is larger than twice the geometry parameter.

6. The apparatus for processing an audio signal according to claim 1, wherein the geometry parameters are based on a largest dimension of the arrangement of the plurality of loudspeakers.

7. The apparatus for processing an audio signal according to claim 1 comprising a high-pass filter configured to attenuate the fundamental frequency determined by the frequency analyzer.

8. The apparatus for processing an audio signal according to claim 1, wherein the signal processor is configured to amplify the overtone of the fundamental frequency.

9. The apparatus for processing an audio signal according to claim 1 comprising a first signal path and a second signal path, wherein the first signal path is configured to process frequencies of the audio signal higher than a characteristic frequency and the second signal path is configured to process frequencies of the audio signal lower than the characteristic frequency, wherein the characteristic frequency is based on the geometry parameter and wherein the frequency analyzer and the signal processor are arranged in the second signal path.

10. The apparatus for processing an audio signal according to claim 1, wherein the processed audio signal is a multi-channel audio signal and comprises a channel signal for each loudspeaker of the plurality of loudspeakers.

11. The apparatus for processing an audio signal according to claim 10, wherein the signal output interface is configured to adapt the plurality of channel signals individually for each loudspeaker.

12. The apparatus for processing an audio signal according to claim 1, wherein the frequency analyzer is configured to determine the lowest frequency of the frequency spectrum of the audio signal as the fundamental frequency.

13. Method for processing an audio signal to focus an acoustic signal by an arrangement of a plurality of loudspeakers, wherein the acoustic signal is based on the audio signal, comprising:

attenuating frequencies higher than a low-pass cut off frequency of a low-pass filter, wherein the low-pass cut off frequency is based on a geometry parameter of the arrangement of the plurality of loudspeakers, wherein the plurality of loudspeakers is arranged in a line and the geometry parameter is equal to the distance of both outermost loudspeakers, or wherein the plurality of loudspeakers is arranged circular and the geometry parameter is equal to the diameter of the circular arrangement;

determining a fundamental frequency in a frequency spectrum of the audio signal depending on the geometry parameter of the arrangement of the plurality of loudspeakers;

generating an overtone of the fundamental frequency;

adapting the overtone of the fundamental frequency to obtain the processed audio signal; and outputting the processed audio signal to the plurality of loudspeakers.

14. Non-transitory storage medium having stored thereon a computer program with a program code for performing, when running on a computer or a microcontroller, the method for processing an audio signal to focus an acoustic signal by an arrangement of a plurality of loudspeakers, wherein the acoustic signal is based on the audio signal, the method comprising:

attenuating frequencies higher than a low-pass cut off frequency of a low-pass filter, wherein the low-pass cut off frequency is based on a geometry parameter of the arrangement of the plurality of loudspeakers, wherein the plurality of loudspeakers is arranged in a line and the geometry parameter is equal to the distance of both outermost loudspeakers, or wherein the plurality of loudspeakers is arranged circular and the geometry parameter is equal to the diameter of the circular arrangement;

determining a fundamental frequency in a frequency spectrum of the audio signal depending on a geometry parameter of the arrangement of the plurality of loudspeakers;

generating an overtone of the fundamental frequency;

adapting the overtone of the fundamental frequency to obtain the processed audio signal; and outputting the processed audio signal to the plurality of loudspeakers.

* * * * *